United States Patent
Feng et al.

(10) Patent No.: US 11,587,473 B2
(45) Date of Patent: Feb. 21, 2023

(54) FLEXIBLE DISPLAY MODULE AND FLEXIBLE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Zikang Feng, Wuhan (CN); Wen Han, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 233 days.

(21) Appl. No.: 16/753,813

(22) PCT Filed: Dec. 19, 2019

(86) PCT No.: PCT/CN2019/126556
§ 371 (c)(1),
(2) Date: Apr. 6, 2020

(87) PCT Pub. No.: WO2021/103213
PCT Pub. Date: Jun. 3, 2021

(65) Prior Publication Data
US 2021/0407334 A1    Dec. 30, 2021

(30) Foreign Application Priority Data

Nov. 28, 2019   (CN) .......................... 20191190796.0

(51) Int. Cl.
*G09F 9/30* (2006.01)
*H01L 27/32* (2006.01)
*H01L 51/52* (2006.01)

(52) U.S. Cl.
CPC .......... *G09F 9/301* (2013.01); *H01L 27/3276* (2013.01); *H01L 51/52* (2013.01); *H01L 2251/5338* (2013.01)

(58) Field of Classification Search
CPC ..... G09F 9/301; H01L 27/3276; H01L 51/52; H01L 2251/5338; H01L 51/0097; H01L 27/3244
See application file for complete search history.

(56) References Cited

U.S. PATENT DOCUMENTS 10,203,790 B2 * 2/2019 Han ................. H01L 51/5281
11,017,716 B2 * 5/2021 Kim ................. H05K 1/0281
(Continued)

FOREIGN PATENT DOCUMENTS

CN    101923812 A    12/2010
CN    104064119 A     9/2014
(Continued)

*Primary Examiner* — S M Sohel Imtiaz
(74) *Attorney, Agent, or Firm* — PV IP PC; Wei Te Chung; Ude Lu (57) ABSTRACT

A flexible display module and a flexible display device are disclosed. The flexible display module includes a flexible display panel, a circuit board, and a display panel protective structure. The flexible display panel includes an effective display portion and a bonding portion. The display panel protective structure is located one a rear of the effective display portion. An indentation is defined in a side of the display panel protective structure away from the effective display portion. The bonding portion is disposed in the indentation and is electrically connected to the effective display portion, and the circuit board is disposed in the indentation and is electrically connected to the bonding portion.

4 Claims, 8 Drawing Sheets

(56) References Cited

U.S. PATENT DOCUMENTS

| | | | |
|---|---|---|---|
| 11,096,293 B2* | 8/2021 | Park | G02F 1/133305 |
| 11,119,537 B2* | 9/2021 | Jeong | G06F 1/1656 |
| 2013/0016303 A1* | 1/2013 | Tokunaga | G02F 1/133308 |
| | | | 349/58 |
| 2014/0285953 A1* | 9/2014 | Hirai | G06F 1/1637 |
| | | | 361/679.01 |
| 2016/0210894 A1* | 7/2016 | Lee | H05K 1/189 |
| 2017/0171939 A1* | 6/2017 | Yang | H05B 33/22 |
| 2018/0092166 A1* | 3/2018 | Kim | H05B 33/04 |
| 2018/0181163 A1* | 6/2018 | Shin | G06F 1/1626 |
| 2019/0129227 A1* | 5/2019 | Hanada | H01L 27/1218 |
| 2020/0192433 A1* | 6/2020 | Shin | H01L 27/3276 |
| 2020/0310577 A1* | 10/2020 | Jeon | H01L 51/0096 |

FOREIGN PATENT DOCUMENTS

| | | | |
|---|---|---|---|
| CN | 205229617 U | | 5/2016 |
| CN | 205303466 U | | 6/2016 |
| CN | 105892568 A | | 8/2016 |
| CN | 107025351 A | | 8/2017 |
| CN | 107886842 A | | 4/2018 |
| CN | 207781603 U | * | 8/2018 |
| CN | 207781603 U | | 8/2018 |
| CN | 108549171 A | | 9/2018 |
| CN | 109637377 A | | 4/2019 |
| CN | 209232314 U | | 8/2019 |
| CN | 110277435 A | | 9/2019 |
| CN | 110390878 A | | 10/2019 |
| CN | 110400520 A | | 11/2019 |
| CN | 209570766 U | | 11/2019 |

* cited by examiner

FLEXIBLE DISPLAY MODULE AND FLEXIBLE DISPLAY DEVICE

The present invention claims the priority of a China patent application No. 201911190796.0 with a subject title of the invention "FLEXIBLE DISPLAY MODULE AND FLEXIBLE DISPLAY DEVICE", which is filed on Nov. 28, 2019 with the China National Intellectual Property Administration (CNIPA), and contents of China patent application are integrated in the present invention by referring thereto.

FIELD OF INVENTION

The present invention relates to a field of display panel technologies, especially relates to a flexible display module and a flexible display device.

BACKGROUND OF INVENTION

A flexible active matrix organic light emitting diode (AMOLED) is a flexible display technology with competitive advantages in the future. By installing flexible display dielectric electronic elements and materials on a flexible or bendable substrate, a display can has a capability of curving and wrapping into any shapes and has characteristics such light weight and compactness for carriage. Especially, a foldable characteristic thereof makes the display panel have a greater displaying region without occupying a greater space. Furthermore, it can cooperate with cover plates with different shapes to achieve display products of different appearances, which facilitates improving a mark share of the product.

A commonly used flexible display screen application solution is bending a bonding end of a display panel such that the bonding end is bent to a rear of the display panel to be bonded to a flexible circuit board on the rear to reduce a bezel region of the display panel and increase a ratio of an effective displaying region of the display panel.

However, the above flexible display screen application solution may encounter the following issue: Because a material of the flexible display screen is soft, the bonding end after bent to the rear of the display panel becomes curved, easily deformed and unstable. The bending process of the bonding end is difficult and the bonding end on the rear of the display is easily contacted wrongly in later processes to cause broken wires of the display panel. Therefore, providing a more reliable bendable display device becomes an important issue.

SUMMARY OF INVENTION

Technical Issue

The present invention provides a flexible display module and a flexible display device that can solve the technical issue that a bonding portion located on a rear of the flexible display module is easily pressed against wrongly to result in rupture of wires of the bonding portion.

Technical Solution

The embodiment of the present invention provides a flexible display module, comprising a flexible display panel, a circuit board, and a display panel protective structure, and the flexible display panel comprising an effective display portion and a bonding portion;

wherein the display panel protective structure is located on a rear of the effective display portion, an indentation is defined in a side of the display panel protective structure away from the effective display portion, wherein the bonding portion is disposed in the indentation and is electrically connected to the effective display portion, and the circuit board is disposed in the indentation and is electrically connected to the bonding portion.

In the flexible display module provided by the embodiment of the present invention, the flexible display panel further comprises a bending portion connecting the effective display portion and the bonding portion; and the display panel protective structure comprises a first sidewall near the bending portion, a side of the indentation near the bending portion extends to the first sidewall, and the bonding portion is bent in the indentation through the bending portion.

In the flexible display module provided by the embodiment of the present invention, a portion of the first sidewall corresponding to the bending portion is located an inner side of the bending portion and contacts the bending portion, and an end of the bending portion near the bonding portion is located in the indentation.

In the flexible display module provided by the embodiment of the present invention, a depth of the indentation is greater than a thickness of any one of the bonding portion and the circuit board.

In the flexible display module provided by the embodiment of the present invention, a backplate disposed in the indentation, wherein the backplate is located on a side of the bonding portion near the effective display portion, a depth of the indentation is greater than a sum of thicknesses of the bonding portion and the backplate.

In the flexible display module provided by the embodiment of the present invention, the display panel protective structure further comprises a second sidewall and a third sidewall disposed adjacent to the first sidewall, and a fourth sidewall disposed opposite to the first sidewall; the second sidewall and the third sidewall are disposed adjacent to the fourth sidewall; each of the second sidewall, the third sidewall, and the fourth sidewall is a tilt surface, and a tilt angle of each of the tilt surfaces is greater than 0° and is less than 90°.

In the flexible display module provided by the embodiment of the present invention, the effective display portion comprises a first flat plate portion, a second flat plate portion, and a folding portion connecting the first flat plate portion and the second flat plate portion, and the first flat plate portion is connected to the bonding portion through the bending portion; and the display panel protective structure comprises a metal sheet, the metal sheet is disposed on a rear of the first flat plate portion, and the indentation is defined in a side of the metal sheet away from the first flat plate portion.

In the flexible display module provided by the embodiment of the present invention, the display panel protective structure further comprises a metal plate; the metal plate corresponds to the first flat plate portion, the second flat plate portion, and the folding portion, and the metal plate is located between the effective display portion and the metal sheet.

In the flexible display module provided by the embodiment of the present invention, the flexible display module further comprises a protective film, the protective film is located the side of the display panel protective structure away from the effective display portion, and the protective film at least covers the indentation.

In the flexible display module provided by the embodiment of the present invention, the circuit board comprises a flexible wire board and a chip on film, an end of the chip on film is bonded to an end of the bonding portion away from the bending portion, and another end of the bonding portion is electrically connected to the flexible wire board.

The embodiment of the present invention also provides a flexible display device, comprising a bottom casing and the flexible display module, wherein the bottom casing is located on a rear of the flexible display module and is configured to carry the flexible display module;

wherein the flexible display module comprises a flexible display panel, a circuit board, and a display panel protective structure, and the flexible display panel comprises an effective display portion and a bonding portion;

wherein the display panel protective structure is located on a rear of the effective display portion, an indentation is defined in a side of the display panel protective structure away from the effective display portion, wherein the bonding portion is disposed in the indentation and is electrically connected to the effective display portion, and the circuit board is disposed in the indentation and is electrically connected to the bonding portion.

In the flexible display device of the embodiment of the present invention, a first limiting structure is disposed on each of two opposite sidewalls of the display panel protective structure; a recess is defined in the bottom casing, corresponds to the display panel protective structure and has a shape and a dimension matching a shape and a dimension of the display panel protective structure, the display panel protective structure and a circuit board and a bonding portion disposed in the indentation are located in the recess, and two second limiting structures are disposed on an inner sidewall of the recess, correspond to the two sidewalls, correspond to the first limiting structures, and are configured to fasten the flexible display module.

In the flexible display device of the embodiment of the present invention, the flexible display panel further comprises a bending portion connecting the effective display portion and the bonding portion; and the display panel protective structure comprises a first sidewall near the bending portion, a side of the indentation near the bending portion extends to the first sidewall, and the bonding portion is bent in the indentation through the bending portion.

In the flexible display device of the embodiment of the present invention, a portion of the first sidewall corresponding to the bending portion is located an inner side of the bending portion and contacts the bending portion, and an end of the bending portion near the bonding portion is located in the indentation.

In the flexible display device of the embodiment of the present invention, a depth of the indentation is greater than a thickness of any one of the bonding portion and the circuit board.

In the flexible display device of the embodiment of the present invention, the display panel protective structure further comprises a second sidewall and a third sidewall disposed adjacent to the first sidewall, and a fourth sidewall disposed opposite to the first sidewall; the second sidewall and the third sidewall are disposed adjacent to the fourth sidewall; each of the second sidewall, the third sidewall, and the fourth sidewall is a tilt surface, and a tilt angle of each of the tilt surfaces is greater than 0° and is less than 90°.

In the flexible display device of the embodiment of the present invention, the inner sidewall of the recess corresponding to the second sidewall, the third sidewall, and the fourth sidewall is a tilt surface, and a title direction and a tilt angle of the inner sidewall of the recess are the same as title directions and the tilt angles of the second sidewall, the third sidewall, and the fourth sidewall.

In the flexible display device of the embodiment of the present invention, the effective display portion comprises a first flat plate portion, a second flat plate portion, and a folding portion connecting the first flat plate portion and the second flat plate portion, and the first flat plate portion is connected to the bonding portion through the bending portion; and the display panel protective structure comprises a metal sheet, the metal sheet is disposed on a rear of the first flat plate portion, and the indentation is defined in a side of the metal sheet away from the first flat plate portion.

In the flexible display device of the embodiment of the present invention, the display panel protective structure further comprises a metal plate; the metal plate corresponds to the first flat plate portion, the second flat plate portion, and the folding portion, and the metal plate is located between the effective display portion and the metal sheet.

In the flexible display device of the embodiment of the present invention, the circuit board comprises a flexible wire board and a chip on film, an end of the chip on film is bonded to an end of the bonding portion away from the bending portion, and another end of the bonding portion is electrically connected to the flexible wire board.

Advantages

Compared to the prior art, the flexible display module and the flexible display device provided by the embodiment of the present invention dispose the display panel protective structure on the rear of the effective display portion of the flexible display panel, and the indentation is defined in the display panel protective structure. Both the electrically connected circuit board and bonding portion are disposed in the indentation. In an aspect, the display panel protective structure is a rigid structure that can prevent pressuring operation on a front side of the effective display portion from resulting in recess and deformation of the effective display portion to affect stability of wire connection between the circuit board and the bonding portion and wire connection between the bonding portion and the effective display portion. In another aspect, both the circuit board and the bonding portion are disposed in the indentation, which can prevent the circuit board and the bonding portion from being contacted directly when the rear of the flexible display module are placed or processed such that chance of broken wires between the circuit board and the bonding portion and on the bonding portion is reduced.

DESCRIPTION OF DRAWINGS

Specific embodiments of the present invention are described in details with accompanying drawings as follows to make technical solutions and advantages of the present invention clear.

DETAILED DESCRIPTION OF PREFERRED EMBODIMENTS

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

In the description of the present invention, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present invention and simplifying the description instead of indicating or implying that the referred device or element must have a specific orientation or position, must to be structured and operated with the specific orientation or position. Therefore, they should not be understood as limitations to the present invention. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present invention, a meaning of "a plurality of" is two or more, unless there is a clear and specific limitation otherwise.

In the description of the present invention, it should be noted that unless clear rules and limitations otherwise exist, terminologies "install", "connect", "connection" should be understood in a broad sense. For instance, the connection can be a fixed connection, a detachable connection or an integral connection. The connection can be a mechanical connection, an electrical connection or a telecommunication. The connection can be a direct connection, an indirect connection through an intermedium, can be an internal communication between two elements or an interaction between the two elements. For a person of ordinary skill in the art, the specific meaning of the above terminology in the present invention can be understood on a case-by-case basis.

In the present invention, it should be noted that unless clear rules and limitations otherwise exist, words "a first feature is "on" or "under" a second feature" can include a direct contact of the first and second features, can also include a contact of the first and second features through another feature therebetween instead of a direct contact. Furthermore, words "the first feature is "above" or "over" the second feature include that the first feature is right above or obliquely above the second feature, or only indicate that a level of the first feature is higher that of the second feature. Words "the first feature is "under" or "below" the second feature include that the first feature is right under or obliquely under the second feature, or only indicate that the level of the first feature is lower than that of the second feature.

The following disclosure provides many different embodiments or examples to achieve different structures of the present invention. To simplify the disclosure of the present invention, the components and arrangements of the specific examples are described below. Of course, they are merely examples, and the purpose is not to limit the present invention. Furthermore, the present invention may repeat reference numerals and/or reference letters in different examples. The repetition is for the purpose of simplification and clarity, and does not by itself indicate the relationship between the various embodiments and/or settings discussed. In addition, the present invention provides examples of various specific processes and materials, but a person of ordinary skill in the art can be aware of the application of other processes and/or the use of other materials.

With reference to FIGS. 1 to 5, the embodiment of the present invention provides a flexible display module 1 comprising a flexible display panel 2, a circuit board 3, and a display panel protective structure 4. The flexible display panel 2 comprises an effective display portion 5 and a bonding portion 6. The display panel protective structure 4 is located on a rear of the effective display portion 5. An indentation 7 is defined on a side of the display panel protective structure 4 away from the effective display portion 5. The bonding portion 6 is disposed in the indentation 7 and is electrically connected to the effective display portion 5. The circuit board 3 is disposed in the indentation 7 and is electrically connected to the bonding portion 6.

Specifically, a material of the display panel protective structure 4 is a rigid material, for example, aluminum alloy r stainless steel. Of course, the specific material of the display panel protective structure 4 is not limited herein. The circuit board 3 and the bonding portion 6 can be adhered in the indentation 7 by adhesive. Of course, they can be fastened in the indentation 7 effectively by other means, which is not limited herein.

Figure 5:
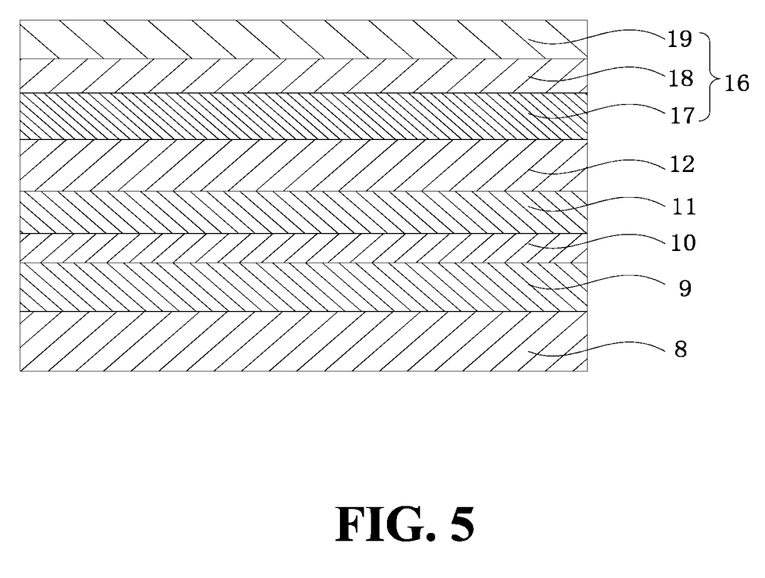
FIG. 5 is a schematic cross sectional structural view of an effective display portion provided by the embodiment of the present invention.

Specifically, with reference to FIG. 5, the effective display portion 5 comprises a first backplate 8, a flexible substrate 9, and a thin film transistor (TFT) array layer 10, a light emitting layer 11, and a thin film encapsulation layer 12 that are sequentially disposed on the flexible substrate 9. According to non-bendable portion and bendable portion, the effective display portion 5 can be divided into a first flat plate portion 13, a second flat plate portion 14, and a folding portion 15 connected the first flat plate portion 13 with the second flat plate portion 14. The first flat plate portion 13 and the second flat plate portion 14 are non-bendable portions, and the folding portion 15 is a bendable portion. The first flat plate portion 13 can be bent and folded with the second flat plate portion 14 through the folding portion 15. The bonding portion 6 comprises the flexible substrate 9 extending from the effective display portion 5, a TFT array layer 10, and the thin film encapsulation layer 12. The TFT array layer 10 located on the bonding portion 6 is electrically connected to the circuit board 3. If the flexible display panel 2 is a touch flexible display panel 2, the flexible display panel 2 further comprises touch panel module 16, the touch panel module 16 comprises a touch layer 17, a polarizer 18, and a cover plate 19 that are sequentially disposed on the thin film encapsulation layer 12.

Specifically, the first backplate 8 is merely disposed on a rear of the flexible substrate 9 in the first flat plate portion 13 and the second flat plate portion 14. The display panel protective structure 4 is disposed on the first backplate 8 in the first flat plate portion 13, and is located on a side of the first backplate 8 away from the flexible substrate 9. It should be explained that the display panel protective structure 4 can also be disposed on first backplate 8 the in the second flat plate portion 14 (not shown in figures). In the meantime, the indentation 7 is only defined on the display panel protective structure 4 corresponding to the first flat plate portion 13, and the display panel protective structure 4 corresponding to the second flat plate portion 14 is for maintaining flatness of the rear of the flexible display module 1 or matching the structural design of the bottom casing during the whole device assembly.

In the present embodiment, the display panel protective structure 4 is disposed on a rear of the effective display portion 5 of the flexible display panel 2, and the indentation 7 is defined in the display panel protective structure 4. Both the electrically connected circuit board 3 and bonding portion 6 are disposed in the indentation 7. In an aspect, the display panel protective structure 4 is a rigid structure that can prevent pressuring operation on a front side of the effective display portion 5 from resulting in recess and deformation of the effective display portion 5 to affect stability of wire connection between the circuit board 3 and the bonding portion 6 and wire connection between the bonding portion 6 and the effective display portion 5. In another aspect, both the circuit board 3 and the bonding portion 6 are disposed in the indentation 7, which can prevent the circuit board 3 and the bonding portion 6 from being contacted directly when the rear of the flexible display module 1 are placed or processed such that chance of broken wires between the circuit board 3 and the bonding portion 6 and on the bonding portion 6 is reduced.

Figure 1:
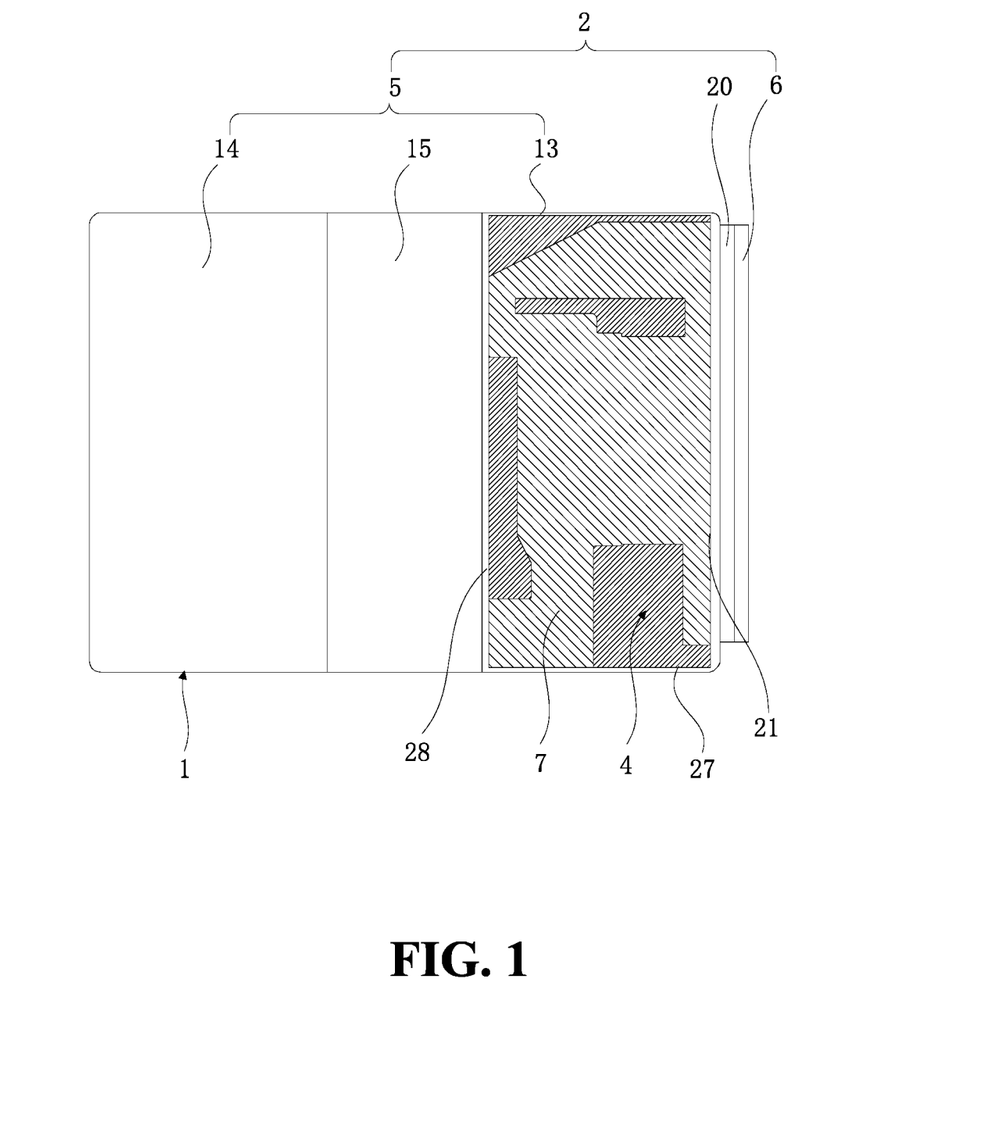
FIG. 1 is a schematic partial top structural view of a flexible display module rear with a bending portion in a non-bending status of the embodiment of the present invention.
Figure 2:
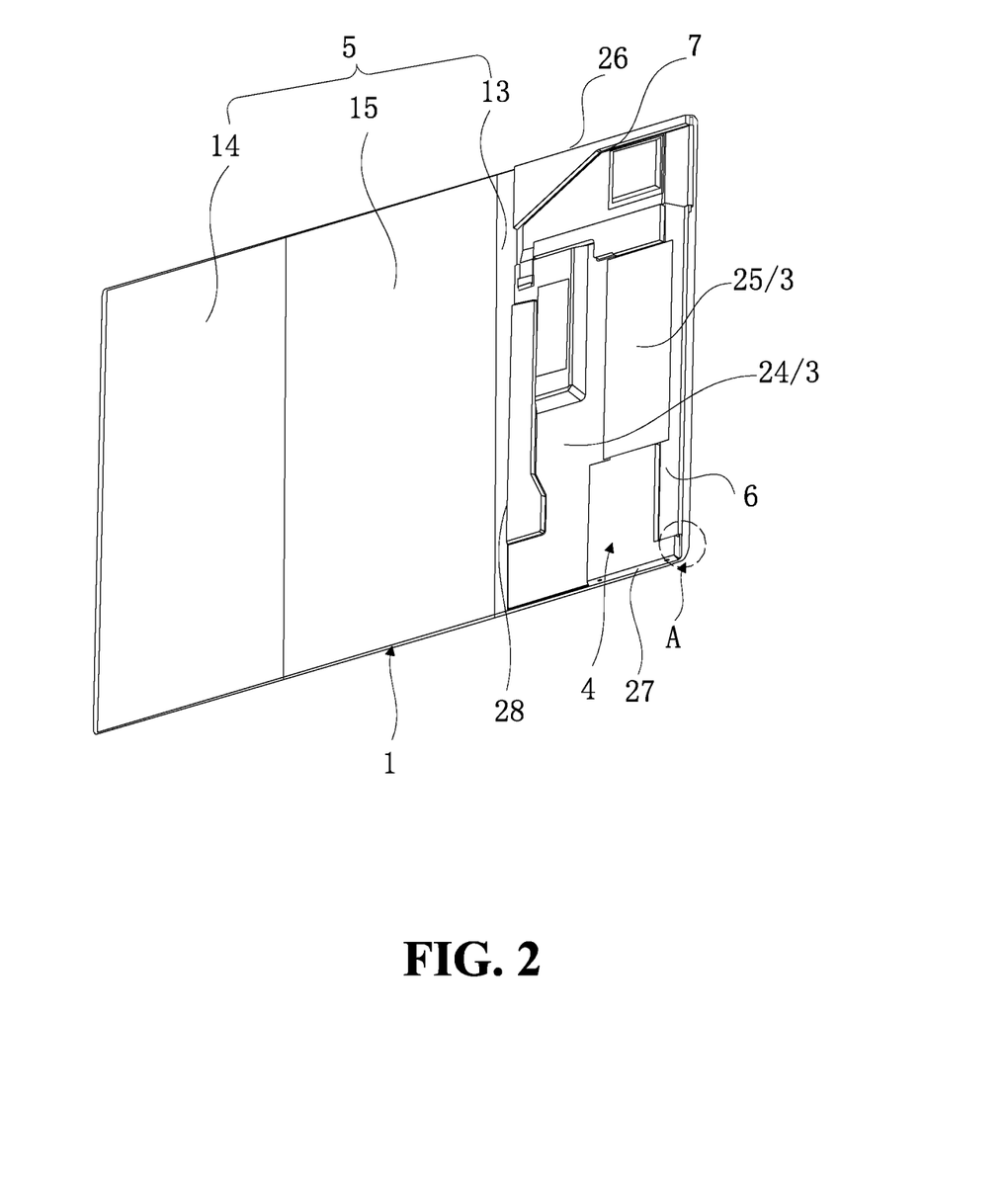
FIG. 2 is a schematic partial structural view of a flexible display module rear provided by the embodiment of the present invention.
Figure 3:
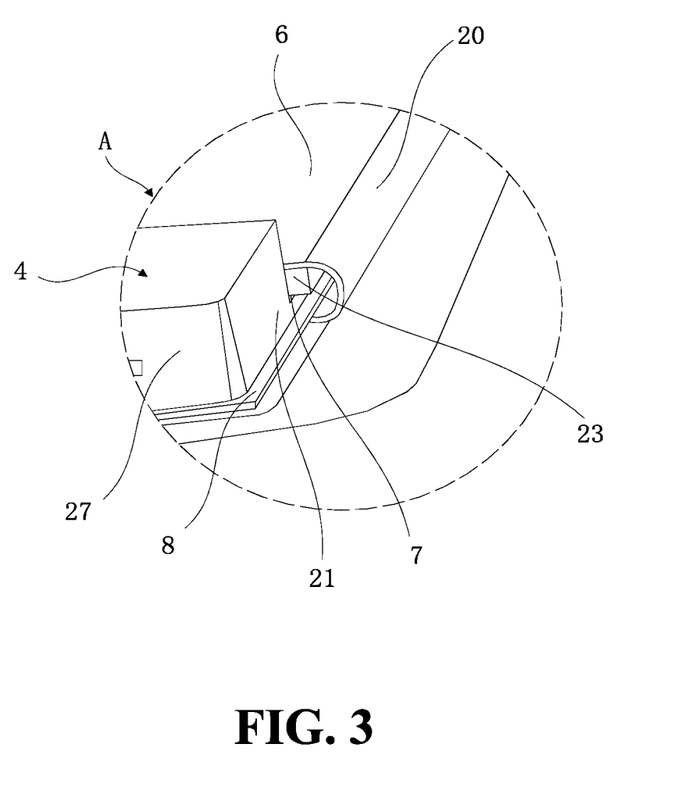
FIG. 3 is a schematic enlarged view of a partial structure A in FIG. 2.

In an embodiment, with reference to FIG. 1, the flexible display panel 2 further comprises a bending portion 20 connecting the effective display portion 5 with bonding portion 6. The display panel protective structure 4 comprises a first sidewall 21 located near the bending portion 20. A side of the indentation 7 near the bending portion 20 extends to the first sidewall 21, and the bonding portion 6 is bent in the indentation 7 through the bending portion 20.

Specifically, first flat plate portion 13 is connected to the bonding portion 6 through the bending portion 20.

Specifically, the bending portion 20 is in a curved and bending status. The bending portion 20 comprises the flexible substrate 9 extending from the effective display portion 5, a TFT array layer 10, and the thin film encapsulation layer 12. The same structures in the bonding portion 6, the bending portion 20, and the effective display portion 5 are formed in the same process.

Specifically, the bonding portion 6 is bent to the rear of the effective display portion 5 through the bending portion 20, and the bonding portion 6 can be directly adhered in the indentation 7 by adhesive, and a backplate can be disposed in the indentation 7 and the bonding portion 6 is bonded to the backplate. Disposing the backplate in the indentation 7 specifically depends on a thickness of the display panel protective structure 4 and a depth of the indentation 7. No matter what means is used for disposing the bonding portion 6 in the indentation 7, the bonding portion 6 and the effective display portion 5 are basically parallel, and a distance between the bonding portion 6 and the flexible substrate 9 matches a bending diameter of the bending portion 20. In other words, a sum of thicknesses of all structures between the bonding portion 6 and the flexible substrate 9 is equal to a bending diameter of a bending surface of the bending portion 20 inner side.

In the present embodiment, the side of the indentation 7 near the bending portion 20 extends to the first sidewall 21 such that a portion of the first sidewall 21 corresponding to the bending portion 20 has a less height, which facilitates bending operation of the bending portion 20 and facilitates the whole bonding portion 6 to be located in the indentation 7 to effectively protect the bonding portion 6.

Figure 4:
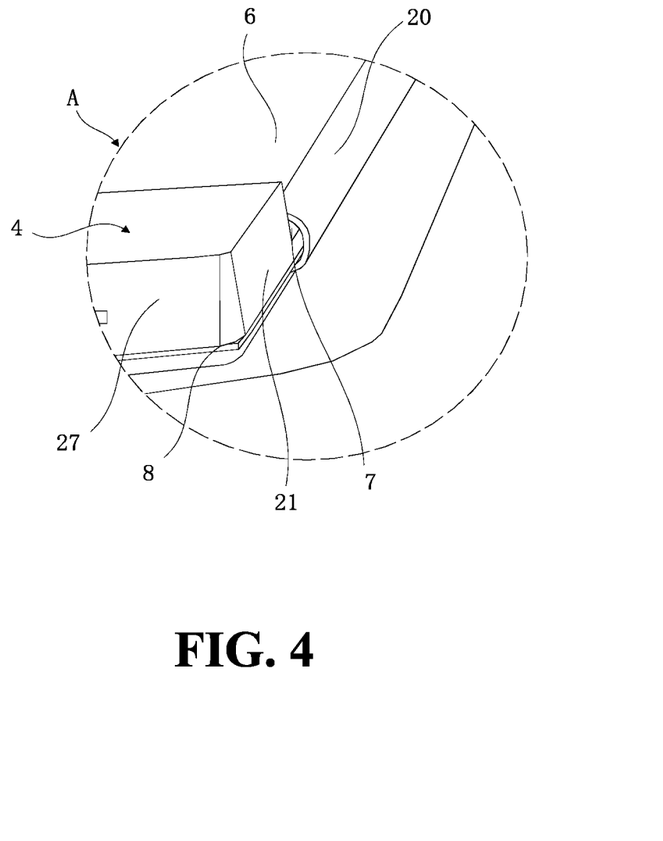
FIG. 4 is a schematic enlarged view of another partial structure A in FIG. 2.

In an embodiment, with reference to FIG. 4, a portion of the first sidewall 21 corresponding to the bending portion 20 is located on an inner side of the bending portion 20 and contacts the bending portion 20. An end of the bending portion 20 near the bonding portion 6 is located in the indentation 7.

Specifically, a portion of the first sidewall 21 located in the inner side of the bending portion 20 can be disposed with a curved protruding structure (not shown in figures), and the curved protruding structure is bonded to and fitted on the inner side of the bending portion 20.

Specifically, a portion of the first sidewall 21 is located in the inner side of the bending portion 20. In other words, the display panel protective structure 4 is disposed on the bending portion 20 connected to the first flat plate portion 13.

In the present embodiment, in an aspect, the bending portion 20 can be wrapped correspondingly on the first sidewall 21 during bending, which facilitates bending processes to prevent unstable deformation of the bending portion 20. In another aspect, after the bending portion 20 is bent, the end thereof near the bonding portion 6 is located in the indentation 7, which facilitates protection of the bending portion 20 and prevents the portion of the bending portion 20 from direct contact and press when the rear of the flexible display module 1 is disposed or other processes are implemented.

In an embodiment, the depth of the indentation 7 is greater than a thickness of one of the bonding portion 6 and the circuit board 3. Specifically, the circuit board 3 comprises a flexible wire board 24 and a chip on film 25. An end of the chip on film 25 is bonded to an end of the bonding portion 6 away from the bending portion 20, and another end of the chip on film 25 is electrically connected to the flexible wire board 24. The depth of the indentation 7 is greater than a sum of thicknesses of chip on film 25 and bonding portion 6 on a bonding position. It should be explained that other assemblies of the flexible display panel 2 can also be bent into the indentation 7. For example, when the flexible display panel 2 is a touch flexible display panel 2, wires extending from the touch layer 17 can be bent to a rear of the flexible display panel 2 and be disposed in the indentation 7. A thickness of the indentation 7 is also greater than a thickness of the wires extending from the touch layer 17. In other words, the thickness of the indentation 7 is greater than a thickness of any one of structures in the indentation 7 or a sum of thicknesses of the structures stacked.

Specifically, a backplate 23 can further be disposed in the indentation 7, the backplate 23 is located on a side of the bonding portion 6 near the effective display portion 5. The depth of the indentation 7 is greater than a sum of thicknesses of the bonding portion 6 of the backplate 23. The backplate 23 is configured to support the bonding portion 6 and control the distance between the bonding portion 6 and the flexible substrate 9 such that the bending portion 20 keeps bent stably.

In the present embodiment, the thickness of the indentation 7 is greater than a height of the bonding portion 6 and a height of the circuit board 3, which can perform a supporting function when the rear of the flexible display module 1 is placed toward the machine stage or performs other processes to prevent the bonding portion 6 and the circuit board 3 from directly contacting the machine stage or being mis-contacted such that a chance of rupture of the wires between the circuit board 3 and the bonding portion 6 and rupture of the wires of the bonding portion 6 is reduced.

In an embodiment, the display panel protective structure 4 further comprises a second sidewall 26 and a third sidewall 27 disposed adjacent to the first sidewall 21, and a fourth sidewall 28 disposed opposite to the first sidewall 21. The second sidewall 26 and the third sidewall 27 are also disposed adjacent to the fourth sidewall 28. Each of the second sidewall 26, the third sidewall 27, and the fourth sidewall 28 is a tilt surface (not shown in figures), and a tilt angle thereof is greater than 0° and less than 90°.

Specifically, second sidewall 26, the third sidewall 27 and the fourth sidewall 28 can be designed to form the tilt surface by a pulling mode or an inverted trapezoid design or a dovetail design.

In the present embodiment, flexible display module 1 is required to be assembled with the corresponding bottom casing during the whole device assembly to form a complete flexible display device 36. Because the display panel protective structure 4 protrudes toward the rear of the flexible display module 1, a recess is generally defined in the bottom casing and corresponds to the protruding display panel protective structure 4, and a dimension and a shape of the recess matches the display panel protective structure 4. Furthermore, corresponding inner walls of the recess, the second sidewall 26, the third sidewall 27, and the fourth sidewall 28 are designed to matching tilt surfaces such that when the flexible display module 1 and the bottom casing are assembled to the whole device, the flexible display module 1 can slide into the bottom casing through the second sidewall 26, the third sidewall 27, and the fourth sidewall 28 of the display panel protective structure 4, which operates simply, assembles conveniently, saves time of whole device assembly, and improve production efficiency.

In an embodiment, a shape of the indentation 7 is the same as a shape of a whole structure formed by the circuit board 3, the bonding portion 6, and other assembly in the indentation 7, and a safe distance is set between the sidewall of the indentation 7 and the circuit board 3, the bonding portion 6, or other assembly to prevent squeeze between the sidewall of the used indentation 7 of the flexible display module 1 and the circuit board 3 or the bonding portion 6 and prevent squeeze and damage to the bonding portion 6 made of comparative soft material.

Figure 8:
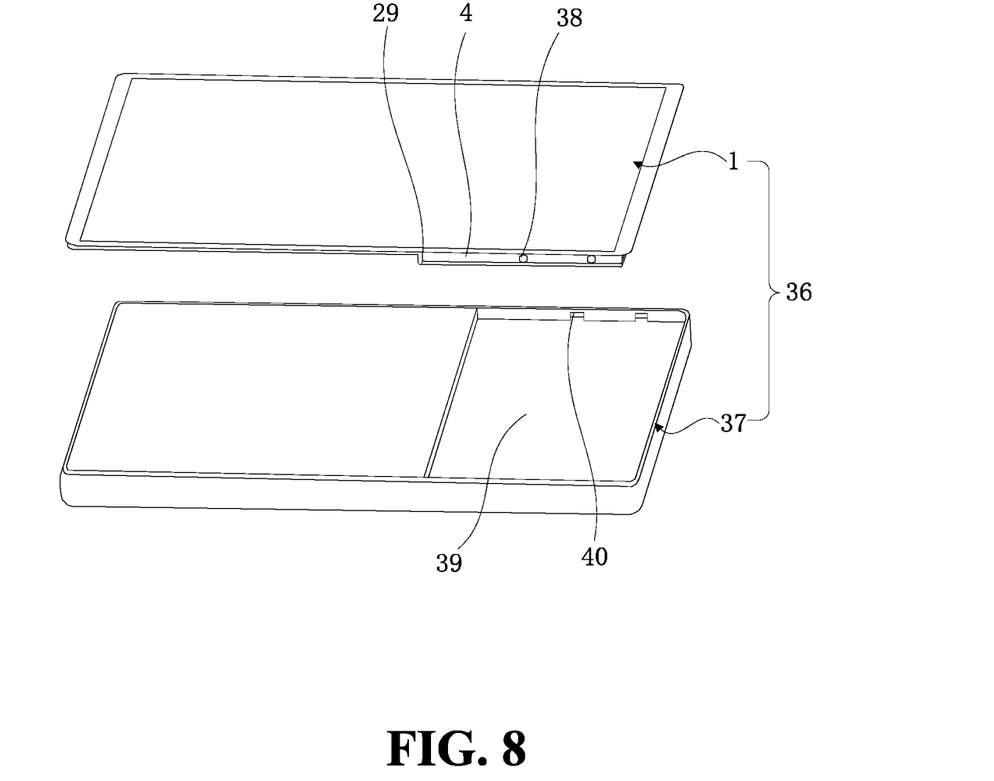
FIG. 8 is a schematic structural view of a flexible display device provided by the embodiment of the present invention.

In an embodiment, with reference to FIG. 8, the flexible display module 1 further comprises a protective film 29. The protective film 29 is located on the side of the display panel protective structure 4 away from the effective display portion 5, and the protective film 29 at least covers the indentation 7.

Specifically, the protective film 29 can only cover the display panel protective structure 4, and can cover the rear of the flexible display panel 2 and the display panel protective structure 4, which is not limited herein.

In the present embodiment, protective film 29 covers the indentation 7, which can further protect the circuit board 3 and the bonding portion 6 in the indentation 7 to prevent direct press and contact with the circuit board 3 and the bonding portion 6 when the rear of the flexible display module 1 is disposed or other processes are implemented such that a chance of rupture of wires between the circuit board 3 and the bonding portion 6 and rupture of wires of the bonding portion 6 is reduced.

Figure 6:
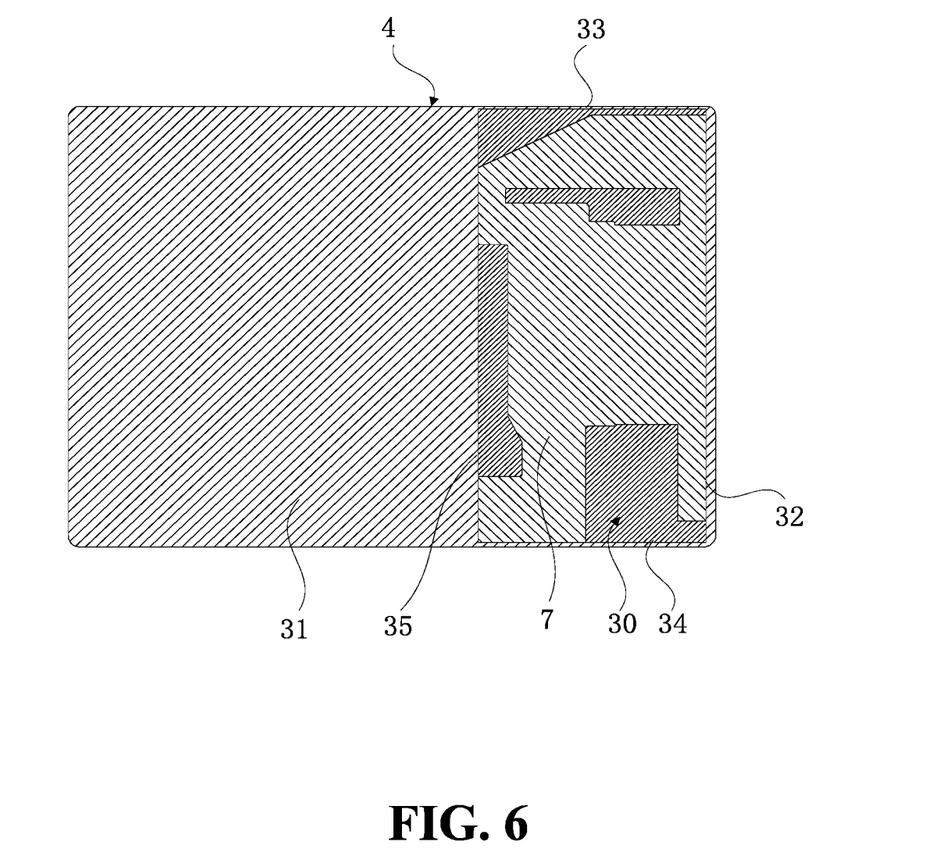
FIG. 6 is a schematic top structural view of a display panel protective structure provided by the embodiment of the present invention.
Figure 7:
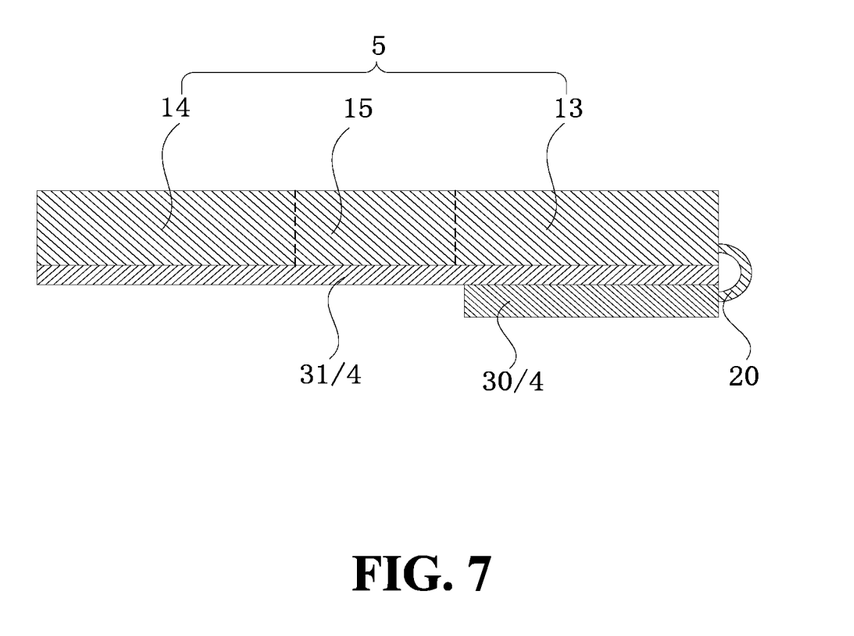
FIG. 7 is a schematic cross sectional structural view of a flexible display module provided by the embodiment of the present invention.

With reference to FIGS. 6 and 7, the embodiment of the present invention provides a flexible display module, and a different thereof from the above embodiment is that the display panel protective structure 4 comprises a metal sheet 30 and a metal plate 31. The metal sheet 30 is disposed on a rear of the first flat plate portion 13, and the indentation 7 is defined in a side of the metal sheet 30 away from the first flat plate portion 13. The metal plate 31 corresponds to the first flat plate portion 13, the second flat plate portion 14, and the folding portion 15, and the metal plate 31 is located between the effective display portion 5 and the metal sheet 30.

Specifically, a material of the metal plate 31 has excellent flexibility, good elastic recovery, good flatness, and pull-resistance, and comprises any one or more of stainless steel sheet, amorphous material, and thermoplastic polyurethanes (TPU). The metal plate 31 can be single-layer structure or a multi-layer structure. When the metal plate 31 is a multi-layer structure, the material of each layer is different, and a material used by the metal plate 31 corresponding to the first flat plate portion 13 and the second flat plate portion 14 can be different from a material used by the metal plate 31 corresponding to the folding portion 15. For example, the material of the metal plate 31 corresponding to the first flat plate portion 13 and the second flat plate portion 14 is stainless steel sheet, and the material of the metal plate 31 corresponding to the folding portion 15 is TPU. Specific structures of the metal plate 31 are not limited herein. A thickness of the metal plate 31 is 0.03 mm-1 mm. The metal sheet 30 is a material has excellent rigidity and includes aluminum alloy or stainless steel. Of course, specific materials of the metal plate 31 and the metal sheet 30 are not limited herein.

Specifically, the thickness of the metal plate 31 is thinner and can be laminated to the first backplate 8 located on the rear of the flexible substrate 9. The metal sheet 30 has excellent rigidity and can be laminated to the metal plate 31, which can achieve lamination of the metal plate 31 and the metal sheet 30 and drastically improve production efficiency. Of course, the metal plate 31 can also be connected to the first backplate 8 through adhesive, and the metal sheet 30 can also be connected to metal plate 31 through adhesive, which is not limited herein.

Specifically, the metal sheet 30 comprises a fifth sidewall 32 (the same as the above first sidewall 21) located near the bending portion 20, a sixth sidewall 33 and a seventh sidewall 34 disposed adjacent to the fifth sidewall 32, and an eighth sidewall 35 disposed opposite to the fifth sidewall 32. The sixth sidewall 33 and the seventh sidewall 34 are also disposed adjacent to the eighth sidewall 35. A side of the indentation 7 near the bending portion 20 extends to the fifth sidewall 32. The sixth sidewall 33, the seventh sidewall 34, and the eighth sidewall 35 (the same as the above second sidewall 26, third sidewall 27, and fourth sidewall 28) are tilt surfaces, and a tilt angle thereof is greater than 0° and is less than 90°.

In the present embodiment, the metal plate 31 and the metal sheet 30 are disposed on the rear of the effective display portion 5 of the flexible display panel 2, the metal sheet 30 is defined with the indentation 7, and the circuit board 3 and the bonding portion 6 are disposed in the indentation 7. In an aspect, the metal sheet 30 is a rigid structure which can prevent press operation on a front of the effective display portion 5 resulting in depression of the effective display portion 5 affecting stability of the wires between the circuit board 3 and the bonding portion 6 and the wires between the bonding portion 6 and the effective display portion 5. In another aspect, both the circuit board 3 and the bonding portion 6 are disposed in the indentation 7, which can prevent direct press and contact with the circuit board 3 and the bonding portion 6 when the rear of the flexible display module 1 is disposed or other processes are implemented such that a chance of rupture of wires between the circuit board 3 and the bonding portion 6 and rupture of wires of the bonding portion 6 is reduced. Furthermore, the metal sheet 30 is made of the rigid material, and the indentation 7 is disposed on the metal sheet 30 and is easily to process. The metal plate 31 is an integral piece and has excellent flexibility, good elastic recovery, good flatness, and pull-resistance, which can effectively support and protect the folding portion 15 of the flexible display panel 2 and assist the folding portion 15 to recover its flatness when the folding portion 15 is expanded to reduce corrugated crease of the folding portion 15, which increases service life of the flexible display module 1 and improves display effect of the flexible display module 1.

With reference to FIG. 8, the embodiment of the present invention also provides a flexible display device 36 comprising a bottom casing 37 and the flexible display module 1 disclosed by the above embodiment. The bottom casing 37 is located on the rear of the flexible display module 1 and is configured to carry the flexible display module 1.

Specifically, a structure of the bottom casing 37 matches the structure of the flexible display module 1. In other words, if a protruding structure is disposed on the rear of the flexible display module 1, then a recessed structure is disposed on the bottom casing 37 and corresponds to the protruding structure in shape and dimension. If a recessed structure is disposed on the rear of the flexible display module 1, then a protruding structure is disposed on the bottom casing 37 and corresponds to the protruding structure in shape and dimension.

Specifically, at least one threaded hole (not shown in figures) can be defined in a side of the display panel protective structure 4 away from the flexible display panel 2, a through hole can be defined in a position of the bottom casing 37 corresponding to the threaded hole. A bolt extends through and fasten the bottom casing 37 and the display panel protective structure 4 securely, and the bottom casing 37 is fastened on the flexible display module 1.

In the present embodiment, a bottom casing 37 is disposed on the rear of the flexible display module 1, and the bottom casing 37 not only protects the flexible display module 1 but also makes the flexible display device 36 beautiful In an embodiment, first limiting structures 38 are disposed on two opposite sidewalls of the display panel protective structure 4. A recess 39 is defined in the bottom casing 37, corresponds to the display panel protective structure 4, and matches the display panel protective structure 4 in shape and dimension. The display panel protective structure 4 and the circuit board 3 and the bonding portion 6 disposed in the indentation 7 are located in the recess 39, and second limiting structures 40 are disposed on two sidewalls of an inner sidewall of the recess 39 and match the first limiting structures 38 for fastening the flexible display module 1.

Specifically, the first limiting structures 38 and second limiting structures 40 cooperate to perform limiting functions. The first limiting structures 38 comprise protrusions or engaging notches. When the first limiting structures 38 are protrusions, the second limiting structures 40 are engaging notches matching the protrusions. When the first limiting structures 38 are engaging notches, the second limiting structures 40 are protrusions matching the engaging notches. Of course, the first limiting structures 38 and the second limiting structures 40 are not limited by the above two structures.

Specifically, the first limiting structures 38 on two sidewalls of the display panel protective structure 4 are arranged symmetrically, and one or more first limiting structures 38 can be disposed on each of the sidewalls. A number of the first limiting structures 38 is the same as a number of the second limiting structures 40 and the first limiting structures 38 correspond to the second limiting structures 40.

Specifically, the first limiting structures 38 are disposed on the second sidewall 26 and the third sidewall 27 of the above embodiment, or are disposed on the sixth sidewall 33 or the seventh sidewall 34.

In the present embodiment, when the flexible display module 1 and the bottom casing 37 are assembled for a whole device, the first limiting structure 38 and the second limiting structures 40 are used for limiting and fastening, which operates simply and facilitates efficiency of whole device assembly. Further, the recess 39 is defined in the bottom casing 37 and corresponds to the display panel protective structure 4, which makes a display surface of the flexible display device 36 flat after whole device assembly, which facilitates improvement of display effect and service life of the flexible display device 36.

In an embodiment, a sidewall of the recess 39 corresponds to the second sidewall 26, and the third sidewall 27 and the fourth sidewall 28 are tilt surfaces. Furthermore, a tilt direction and a tilt angle of the sidewall of the recess 39 are the same as tilt directions and tilt angles of the second sidewall 26, the third sidewall 27, and the fourth sidewall 28 such that when the flexible display module 1 and the bottom casing 37 are assembled for a whole device, flexible display module 1 can slide into the bottom casing 37 through the second sidewall 26, the third sidewall 27, and the fourth sidewall 28 of the display panel protective structure 4, which operates simply, assembles conveniently, saves time of whole device assembly, and improve production efficiency.

In the above-mentioned embodiments, the descriptions of the various embodiments are focused. For the details of the embodiments not described, reference may be made to the related descriptions of the other embodiments.

As described above, the flexible display module and the flexible display device provided by the embodiment of the present invention are introduced in detail. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. A flexible display module, comprising a flexible display panel, a circuit board, and a display panel protective structure, and the flexible display panel comprising an effective display portion and a bonding portion;

wherein the display panel protective structure is located on a rear of the effective display portion, an indentation is defined in a side of the display panel protective structure away from the effective display portion, wherein the bonding portion is disposed in the indentation and is electrically connected to the effective display portion, and the circuit board is disposed in the indentation and is electrically connected to the bonding portion;

wherein the flexible display panel further comprises a bending portion connecting the effective display portion and the bonding portion; and the display panel protective structure comprises a first sidewall near the bending portion, a side of the indentation near the bending portion extends to the first sidewall, and the bonding portion is bent in the indentation through the bending portion;

wherein the effective display portion comprises a first flat plate portion, a second flat plate portion, and a folding portion connecting the first flat plate portion and the second flat plate portion, and the first flat plate portion is connected to the bonding portion through the bending portion; and the display panel protective structure comprises a metal sheet, the metal sheet is disposed on a rear of the first flat plate portion, and the indentation is defined in a side of the metal sheet away from the first flat plate portion;

wherein the display panel protective structure further comprises a metal plate; the metal plate corresponds to the first flat plate portion, the second flat plate portion, and the folding portion, and the metal plate is located between the effective display portion and the metal sheet.

2. The flexible display module as claimed in claim 1, wherein a portion of the first sidewall corresponding to the bending portion is located on an inner side of the bending portion and contacts the bending portion, and an end of the bending portion near the bonding portion is located in the indentation.

3. The flexible display module as claimed in claim 1, wherein the display panel protective structure further comprises a second sidewall and a third sidewall disposed adjacent to the first sidewall, and a fourth sidewall disposed opposite to the first sidewall; the second sidewall and the third sidewall are disposed adjacent to the fourth sidewall; each of the second sidewall, the third sidewall, and the fourth sidewall is a tilt surface, and a tilt angle of each of the tilt surfaces is greater than 0° and is less than 90°.

4. The flexible display module as claimed in claim 1, wherein the circuit board comprises a flexible wire board and a chip on film, an end of the chip on film is bonded to an end of the bonding portion away from the bending portion, and another end of the bonding portion is electrically connected to the flexible wire board.

* * * * *